US012183603B2

(12) United States Patent
Mori et al.

(10) Patent No.: US 12,183,603 B2
(45) Date of Patent: Dec. 31, 2024

(54) PROCESSING MODULE AND PROCESSING METHOD

(71) Applicant: Tokyo Electron Limited, Tokyo (JP)

(72) Inventors: Kiyoshi Mori, Fuchu (JP); Takayuki Yamagishi, Fuchu (JP)

(73) Assignee: Tokyo Electron Limited, Tokyo (JP)

(*) Notice: Subject to any disclaimer, the term of this patent is extended or adjusted under 35 U.S.C. 154(b) by 270 days.

(21) Appl. No.: 17/646,571

(22) Filed: Dec. 30, 2021

(65) Prior Publication Data

US 2022/0216073 A1 Jul. 7, 2022

(30) Foreign Application Priority Data

Jan. 7, 2021 (JP) .................. 2021-001650

(51) Int. Cl.
*H01L 21/67* (2006.01)
*H01L 21/677* (2006.01)
*H01L 21/687* (2006.01)

(52) U.S. Cl.
CPC .... *H01L 21/6719* (2013.01); *H01L 21/67742* (2013.01); *H01L 21/68764* (2013.01)

(58) Field of Classification Search
CPC .................................................. H01L 21/6719
See application file for complete search history.

(56) References Cited

U.S. PATENT DOCUMENTS

2003/0178142 A1* 9/2003 de Ridder ......... H01L 21/67769
118/712
2021/0013055 A1* 1/2021 Schaller ............ H01L 21/67742

FOREIGN PATENT DOCUMENTS

JP H11-145241 A 5/1999
JP 2018-139287 A 9/2018
JP 2019-220509 A 12/2019

* cited by examiner

*Primary Examiner* — Saul Rodriguez
*Assistant Examiner* — Willie W Berry, Jr.
(74) *Attorney, Agent, or Firm* — Armstrong Teasdale LLP

(57) ABSTRACT

A processing module includes: a processing container including therein processing spaces in which stages are disposed, respectively, wherein a center of each of the processing spaces is located on a same circumference; a rotation arm including holders configured to hold wafers, which are placed on the stages of the processing spaces, respectively, wherein the rotation arm is rotatable around a center of the circumference as a rotation axis; and a sensor located between adjacent processing spaces and configured to detect positions of the wafers held by the rotation arm during rotational operation of the rotation arm.

9 Claims, 9 Drawing Sheets

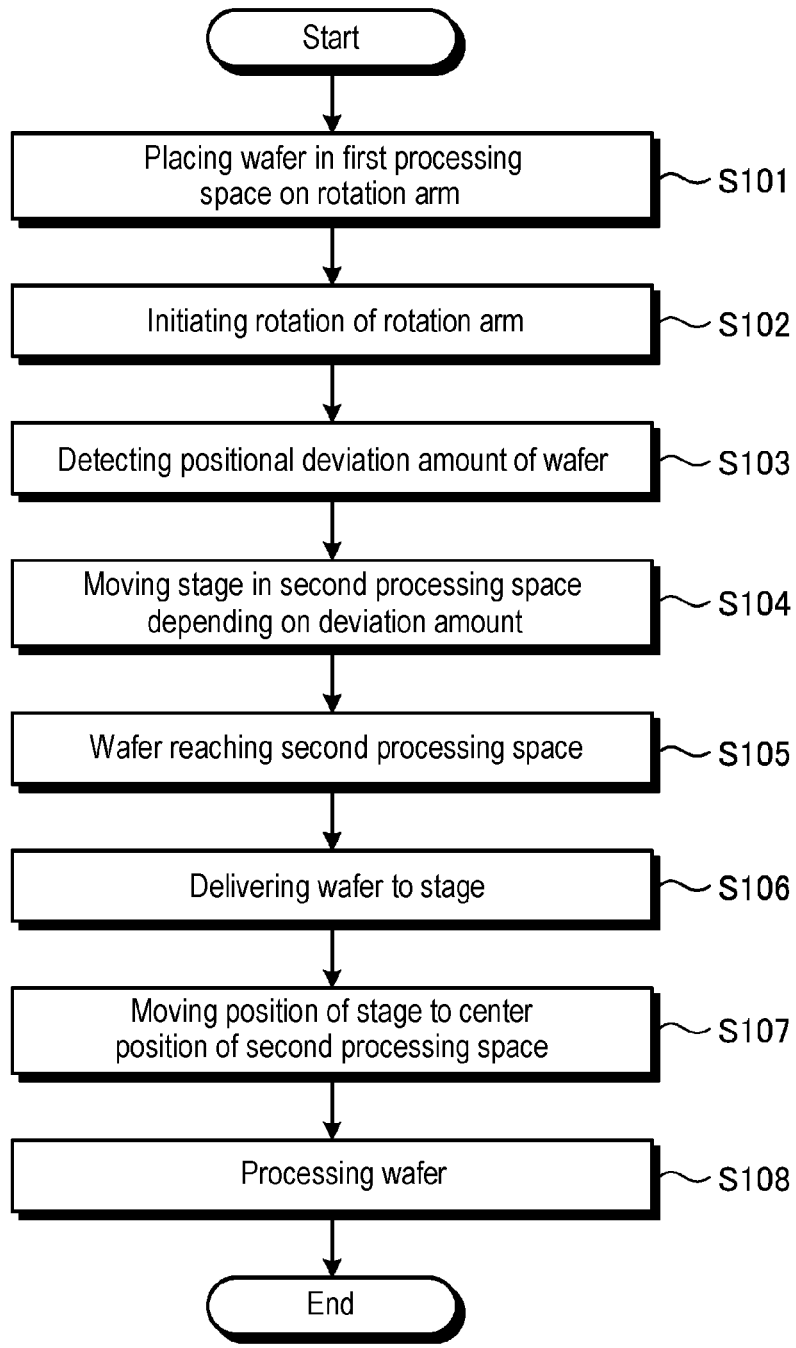

PROCESSING MODULE AND PROCESSING METHOD

CROSS-REFERENCE TO RELATED APPLICATION

This application is based upon and claims the benefit of priority from Japanese Patent Application No. 2021-001650, filed on Jan. 7, 2021, the entire contents of which are incorporated herein by reference.

TECHNICAL FIELD

The present disclosure relates to a processing module and a processing method.

BACKGROUND

As a processing module that processes a substrate (hereinafter, also referred to as a "wafer") in a substrate processing system, a processing module in which wafers are simultaneously processed in one processing container is known (Patent Document 1).

PRIOR ART DOCUMENT

[Patent Document]
Patent Document 1: Japanese Laid-Open Patent Publication No. 2019-220509

SUMMARY

According to one embodiment of the present disclosure, there is provided a processing module. The processing module includes: a processing container including therein processing spaces in which stages are disposed, respectively, wherein a center of each of the processing spaces is located on a same circumference in the processing container in a plan view; a rotation arm including holders configured to hold wafers, which are placed on the stages of the processing spaces, respectively, wherein the rotation arm is rotatable around a center of the circumference as a rotation axis; and a sensor located between adjacent processing spaces among the processing spaces and configured to detect positions of the wafers held by the rotation arm during rotational operation of the rotation arm.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a flowchart illustrating a processing procedure executed by the substrate processing apparatus in the present embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a processing module and a processing method disclosed herein will be described in detail with reference to the drawings. The technology disclosed herein is not limited by the following embodiments.

In a processing module in which the wafers are processed simultaneously in one processing container, processing spaces may be provided in the processing container, and different processes may be performed on the wafers in two or more of the processing spaces. In such a case, in the processing module, the wafers are transferred between two or more processing spaces. The wafer transfer between the two or more processing spaces is generally performed using a wafer transfer mechanism that carries the wafers into and out of the processing container. Therefore, the transfer process by the wafer transfer mechanism may be complicated.

Meanwhile, a technique may be conceived in which a rotation arm is installed in the processing container and substrates are transferred between two or more processing spaces by the rotation arm. However, when transferring the wafers by the rotation arm in the processing container, the positions of the wafers may be deviated from predetermined reference positions (e.g., the centers of processing spaces of a transfer destination or the like) due to positional deviation, vibration of the rotation arm, or the like during wafer delivery. The positional deviation of the wafers is a factor that reduces the uniformity of wafer processing. Therefore, it is expected to detect the positional deviation of wafers during transfer in the processing container.

Embodiment

[Configuration of Substrate Processing System]

Figure 1:
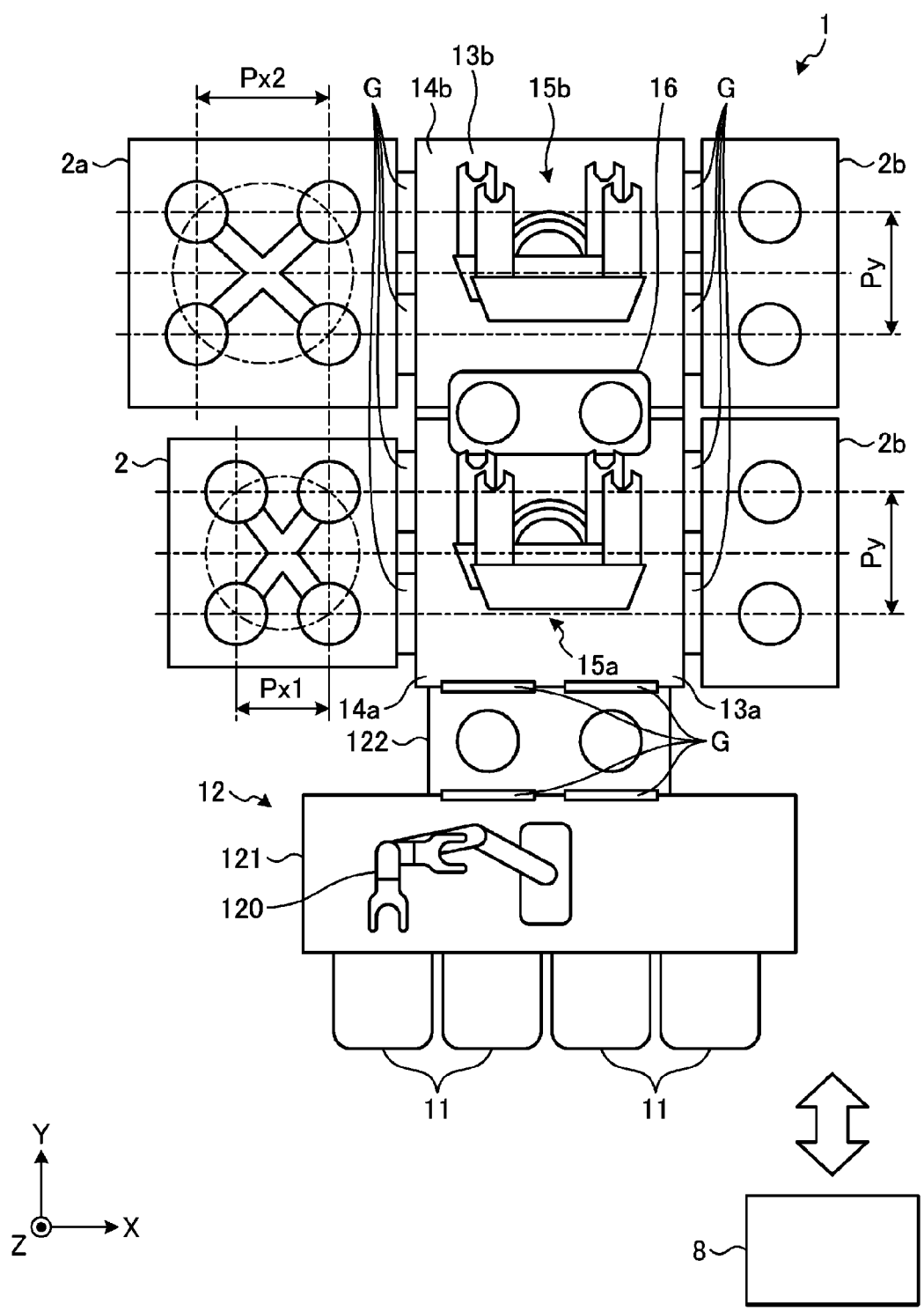
FIG. 1 is a schematic plan view illustrating an example of a configuration of a substrate processing system in an embodiment of the present disclosure.

FIG. 1 is a schematic plan view illustrating an example of a configuration of a substrate processing system in an embodiment of the present disclosure. The substrate processing system 1 illustrated in FIG. 1 includes carry-in/out ports 11, a carry-in/out module 12, vacuum transfer modules 13*a* and 13*b*, and substrate processing apparatuses 2, 2*a* and 2b. Referring to FIG. 1, a description is made assuming that the X direction is the left-right direction, the Y direction is the front-rear direction, the Z direction is the up-down direction (height direction), and the carry-in/out ports 11 are located at the front side in the front-rear direction. The carry-in/out ports 11 are connected to the front side of the carry-in/out module 12, and the vacuum transport module 13a is connected to the rear side of the carry-in/out module 12 in the front-rear direction.

Carriers, which are transport containers containing target substrates, are placed on the carry-in/out ports 11, respectively. The substrates are wafers W, which are circular substrates having a diameter of, for example, 300 mm. The carry-in/out module 12 is a module configured to perform carry-in/out of the wafers W between the carriers and the vacuum transport module 13a. The carry-in/out module 12 includes a normal-pressure transfer chamber 121 in which the wafers W are delivered to and from the carriers in a normal-pressure atmosphere by a transfer mechanism 120, and a load-lock chamber 122 configured to switch the atmosphere in which the wafers W are placed between the normal-pressure atmosphere and the vacuum atmosphere.

The vacuum transfer modules 13a and 13b have vacuum transfer chambers 14a and 14b, respectively, in which a vacuum atmosphere is formed. Substrate transfer mechanisms 15a and 15b are disposed inside the vacuum transfer chambers 14a and 14b, respectively. Between the vacuum transfer module 13a and the vacuum transfer module 13b, a path 16 in which the delivery of the wafer W is performed between the vacuum transfer modules 13a and 13b is disposed. Each of the vacuum transfer chambers 14a and 14b is formed in, for example, a rectangular shape in a plan view. Among the four side walls of the vacuum transfer chamber 14a, the substrate processing apparatuses 2 and 2b are connected to the sides facing each other in the left-right direction. Among the four side walls of the vacuum transfer chamber 14b, the substrate processing apparatuses 2a and 2b are connected to the sides facing each other in the left-right direction, respectively.

Among the four side walls of the vacuum transfer chamber 14a, the load-lock chamber 122 installed in the carry-in/out module 12 is connected to the front side. Gate valves G are arranged between the normal-pressure transfer chamber 121 and the load-lock chamber 122, between the load-lock chamber 122 and the vacuum transfer module 13a, and between the vacuum transfer modules 13a and 13b and the substrate processing apparatuses 2, 2a, and 2b. The gate valves G open and close the carry-in/out ports of the wafer W, which are provided in mutually connected modules, respectively.

The substrate transfer mechanism 15a transfers the wafers W among the carry-in/out module 12, the substrate processing apparatuses 2 and 2b, and the path 16 in a vacuum atmosphere. In addition, the substrate transfer mechanism 15b transfers the wafers W between the path 16 and the substrate processing apparatuses 2a and 2b in a vacuum atmosphere. Each substrate transfer mechanism 15a or 15b is configured as an articulated arm, and includes a substrate holder configured to hold the wafer W. Each substrate processing apparatus 2, 2a, or 2b collectively processes the wafers W (e.g., two or four) using a process gas in a vacuum atmosphere. Therefore, the substrate holder of each substrate transfer mechanism 15a or 15b is configured to be capable of simultaneously holding, for example, two wafers W to collectively deliver two wafers W to the substrate processing apparatus 2, 2a, or 2b. In each substrate processing apparatus 2 or 2a, the wafers W received from stages located at the vacuum transfer module 13a or 13b side can be transferred to the stages located at the inner side by the rotation arm provided inside the substrate processing apparatus. In addition, the substrate processing apparatus 2 or 2a may detect the positions of the wafers W by a sensor provided therein during transfer of the wafers W by the rotation arm.

The pitch of the stages in the Y direction (row interval) is a pitch Py that is common to the substrate processing apparatuses 2, 2a, and 2b. Thus, the substrate processing apparatuses 2, 2a, and 2b can be connected to any locations of the sides of the vacuum transfer modules 13a and 13b, the sides being opposite to each other in the left-right direction. In the example of FIG. 1, the substrate processing apparatus 2 and the substrate processing apparatus 2b are connected to the vacuum transfer module 13a, and the substrate processing apparatus 2a and the substrate processing apparatus 2b are connected to the vacuum transfer module 13b. The substrate processing apparatus 2 and the substrate processing apparatus 2a differ from each other in the diameter of a reactor (a processing container) including a processing space corresponding to one stage according to a process application, and thus have different pitches Px1 and Px2, which are pitches of the stages in the X direction (column interval). In the substrate processing apparatus 2a, the pitch Px2 has the same value as the pitch Py. That is, the pitch Py corresponds to the size of the largest reactor. That is, since the size of the reactor of the substrate processing apparatus 2 is smaller than that of the substrate processing apparatus 2a, the pitch Px1 may be set to be smaller than the pitch Px2.

The substrate processing apparatus 2b is a type of substrate processing apparatus having two stages and is configured such that wafer transfer is not performed in the substrate processing apparatus 2b, and that two wafers are simultaneously carried in to be processed and then simultaneously carried out.

The substrate processing system 1 has a controller 8. The controller 8 is, for example, a computer including a processor, a storage part, an input device, a display device, and the like. The controller 8 controls each part of the substrate processing system 1. With the controller 8, an operator may perform a command input operation or the like using the input device in order to manage the substrate processing system 1. In addition, in the controller 8, the operating state of the substrate processing system 1 may be visualized and displayed by the display device. In addition, the storage part of the controller 8 stores a control program, recipe data, and the like used by the processor to control various processes executed by the substrate processing system 1. The processor of the controller 8 executes the control program to control each part of the substrate processing system 1 according to the recipe data, whereby desired substrate processing is executed in the substrate processing system 1.

[Configuration of Substrate Processing Apparatus]

Figure 2:
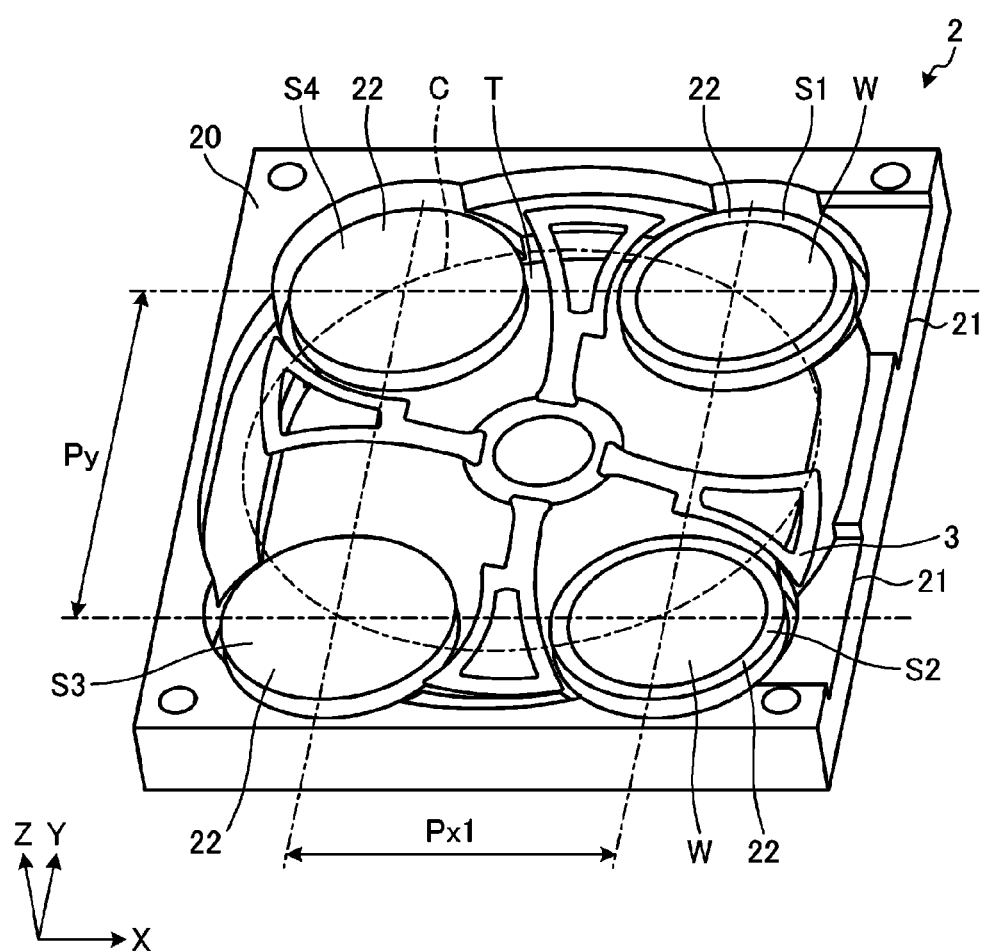
FIG. 2 is an exploded perspective view illustrating an example of a configuration of a substrate processing apparatus in the present embodiment.

Next, an example in which the substrate processing apparatuses 2 and 2a are applied to, for example, a film forming apparatus that performs a plasma chemical vapor deposition (CVD) process on wafers W will be described with reference to FIGS. 2 to 8. FIG. 2 is an exploded perspective view illustrating an example of a configuration of a substrate processing apparatus in the present embodiment. The internal configuration of the substrate processing apparatus 2a is basically the same as that of the substrate processing apparatus 2, except for the fact that the pitch Px2 is different from the pitch Px1 and the arrangement positions of sensors capable of detecting the positions of wafers W. Therefore, in the following, the description of the substrate processing apparatus 2a that overlaps that of the substrate processing apparatus 2 will be omitted, and the substrate processing apparatus 2 will be described as a representative example. The substrate processing apparatuses 2 and 2a are examples of processing modules.

As illustrated in FIG. 2, the substrate processing apparatus 2 includes a processing container (a vacuum container) 20 having a rectangular shape in a plan view. The processing container 20 is configured to maintain the interior thereof in a vacuum atmosphere. The processing container 20 is configured by closing the top open portion with a gas supply part 4 and a manifold 36 to be described later. In FIG. 2, internal partition walls and the like are omitted such that the relationship between the processing spaces S1 to S4 and the rotation arm 3 can be easily understood. The processing container 20 includes two carry-in/out port ports 21 formed in the side surface thereof connected to the vacuum transfer chamber 14a or 14b to be arranged in the Y direction. The carry-in/out ports 21 are opened and closed by the gate valves G.

Processing spaces S1 to S4 are provided inside the processing container 20. A stage 22 is arranged in each of the processing spaces S1 to S4. The stage 22 is movable in the vertical direction to move upward when a wafer W is processed and to move downward when a wafer W is transferred. Under the processing spaces S1 to S4, a transfer space T is provided which connects the processing spaces S1 to S4 and through which wafers W are transferred by the rotation arm 3. In addition, the transfer space T under the processing spaces S1 and S2 is connected to each carry-in/out port 21 so that carry-in/out of wafers W is performed between the vacuum transfer chambers 14a and 14b by the substrate transfer mechanisms 15a and 15b.

The respective centers of the processing spaces S1 to S4 are located on the same circumference C. The center of the circumference C coincides with the center of the substrate processing apparatus 2, namely, the center of the processing container 20. That is, when viewed from the top side, the respective centers of the processing spaces S1 to S4 are arranged on the circumference C, the center of which coincides with the center of the processing container 20.

The stages 22 of the processing spaces S1 to S4 are laid out in 2 rows and 2 columns when viewed from the top side. The layout has different dimensions for row and column intervals. That is, when comparing the pitch Py in the Y-direction pitch of the stages 22 (row interval) and the pitch Px1 in the X-direction pitch (column interval), the pitch Py>the pitch Px1.

Figure 3:
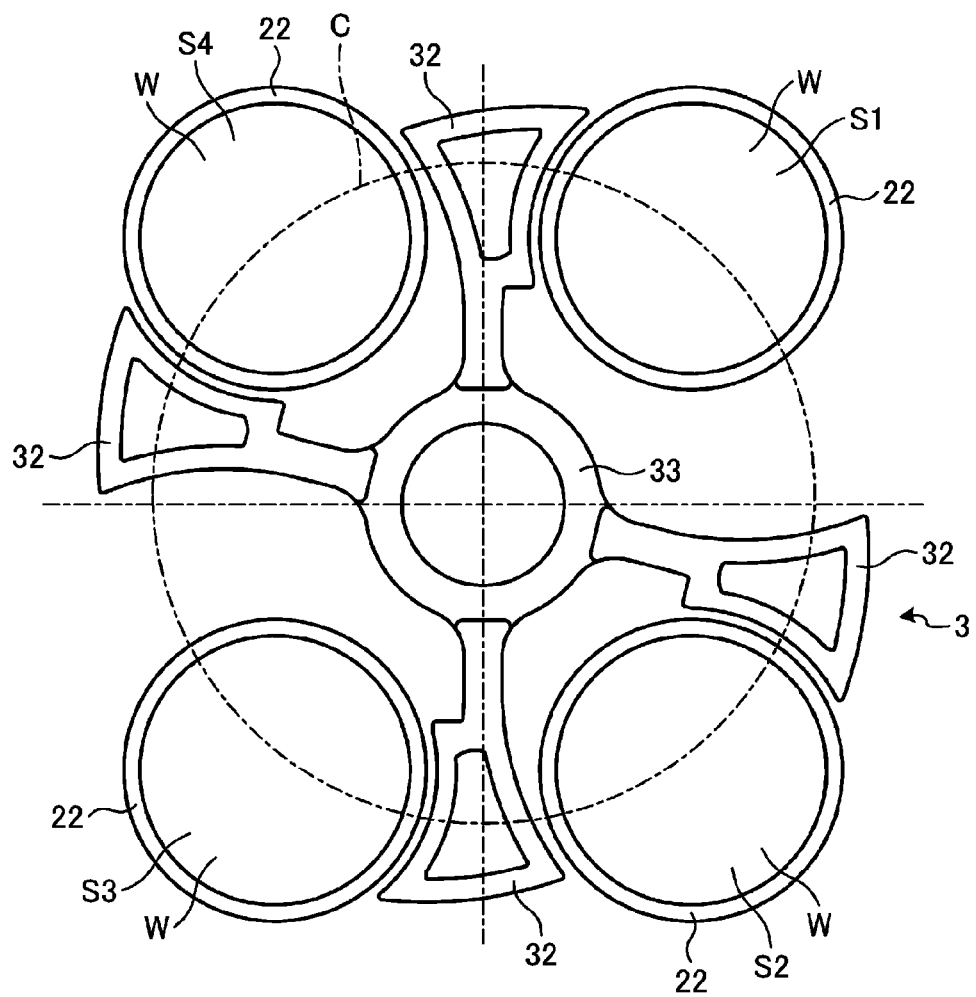
FIG. 3 is a view illustrating an example of a positional relationship between processing spaces and a rotation arm at a standby position.
Figure 4:
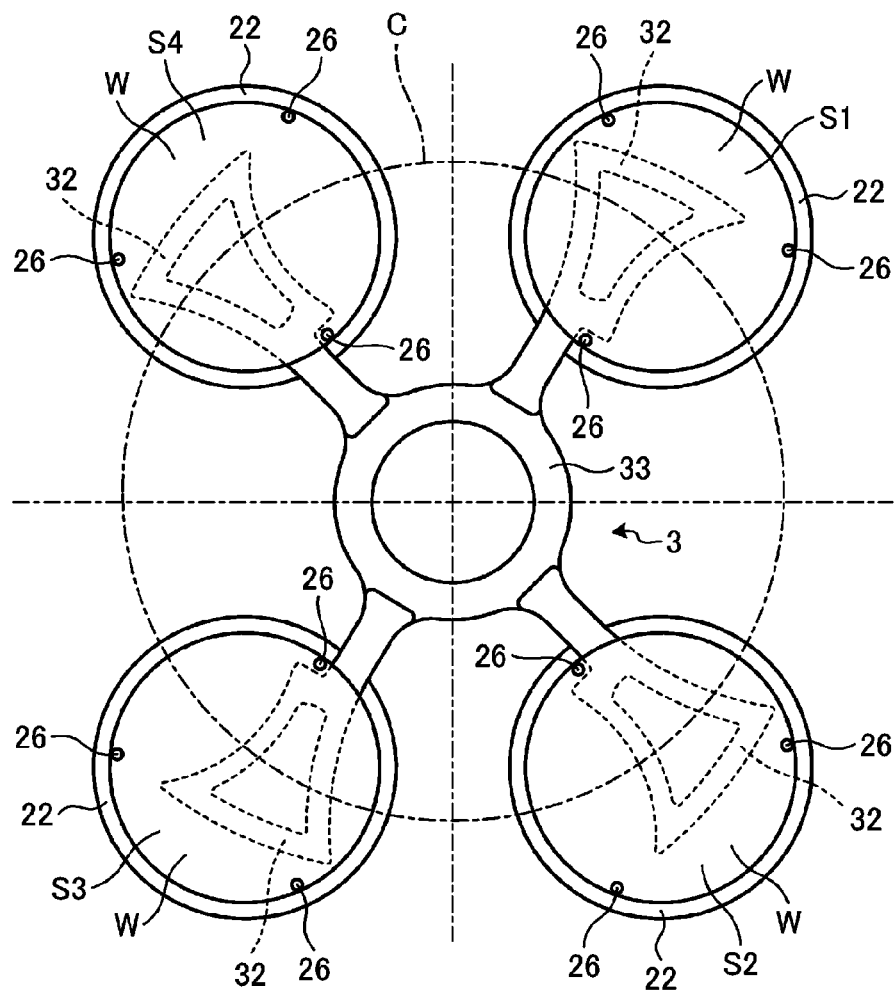
FIG. 4 is a view illustrating an example of a positional relationship between the processing spaces and the rotation arm at a wafer holding position.

FIG. 3 is a view illustrating an example of a positional relationship between the processing spaces and the rotation arm at a standby position. FIG. 4 is a view illustrating an example of a positional relationship between the processing spaces and the rotation arm at a wafer holding position. As illustrated in FIGS. 3 and 4, the rotation arm 3 includes four end effectors 32 capable of holding wafers W to be placed on the stages 22, respectively, and a base member 33 having a rotation axis located at the center position of the circumference C, and is provided to be rotatable about the center of the circumference C as a rotation axis. The four end effectors 32 are connected to the base member 33 to form an X shape. The X shape of the rotation arm 3 has a configuration in which the dimension in the Y direction corresponding to the row interval of the X shape and the dimension in the X direction corresponding to the column interval of the X shape differ from each other at the wafer W holding position illustrated in FIG. 4.

By being located among respective processing spaces S1 to S4 at the standby position illustrated in FIG. 3, the rotation arm 3 does not hinder the vertical movement of each stage 22. FIG. 3 illustrates the state in which the wafer W is placed on each stage 22. A description will be made of the movement of the rotation arm 3 when the wafers are transferred such that the wafers W in the first column and the wafers W in the second column are interchanged from this state, that is, when the wafers W in the processing spaces S1 and S2 are transferred to the processing spaces S3 and S4, and the wafers W in the processing spaces S3 and S4 are transferred to the processing spaces S1 and S2.

First, respective stage 22 are moved to delivery positions in the transfer space T at the lower side, and lift pins 26 provided on respective stages 22 to be described later are raised to lift the wafers W. Next, the rotation arm 3 is rotated clockwise by about 30 degrees to insert respective end effectors 32 between the stages 22 and the wafers W as illustrated in FIG. 4. Subsequently, the lift pins 26 are lowered to place the wafers W on respective end effectors 32. Next, the rotation arm 3 is rotated 180 degrees clockwise to transfer the wafers W to holding positions on respective stages 22. When the respective stages 22 raise the lift pins 26 to receive the wafers W, the rotation arm 3 is rotated counterclockwise by about 30 degrees to move to the standby position. In this way, the wafers W can be transferred by the rotation arm 3 such that the wafers W in the first column and the wafers W in the second column are interchanged with each other. As a result, for example, when different processes (e.g., a film forming process and an annealing process) are performed in the processing spaces S1 and S2 and the processing spaces S3 and S4, respectively, the wafers W can be transferred by the rotation arm 3 between the processing spaces S1 and S2 and the processing spaces S3 and S4. Therefore, for example, when different processes are repeated in the processing spaces S1 and S2 and the processing spaces S3 and S4 (e.g., when the film forming process and the annealing process are repeated), the time related to the transfer of the wafers W is shortened.

Figure 5:
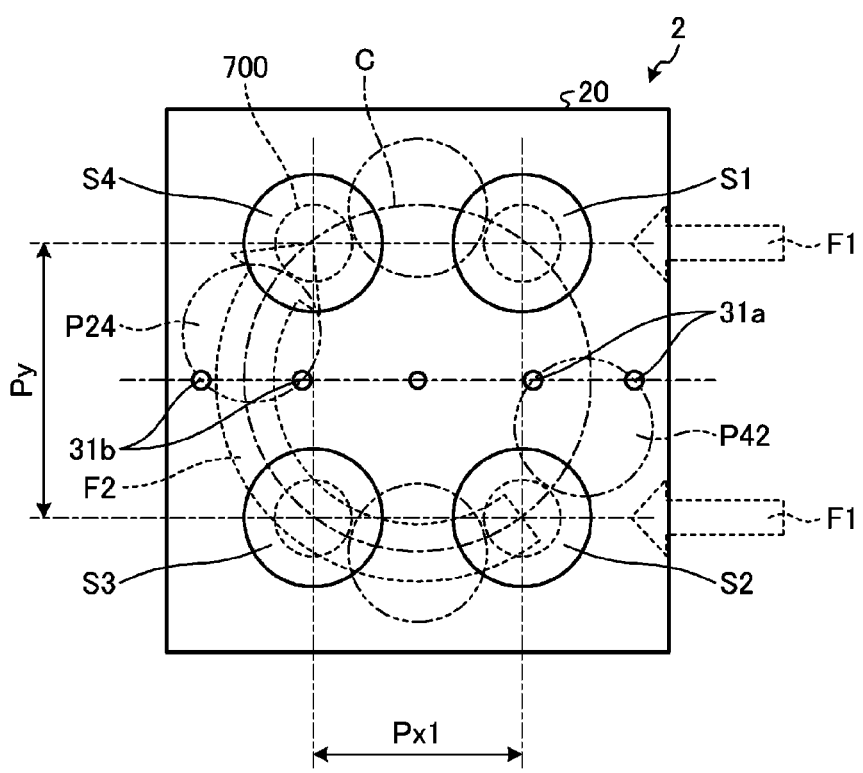
FIG. 5 is a view illustrating an example of wafer movement paths in the substrate processing apparatus in the present embodiment.

FIG. 5 is a view illustrating an example of wafer movement paths in the substrate processing apparatus in the present embodiment. FIG. 5 illustrates the movement paths when the wafers W are transferred from the vacuum transfer chamber 14a to the interior of the substrate processing apparatus 2. First, by the substrate transfer mechanism 15a of the vacuum transfer chamber 14a, as illustrated by the paths F1, at the delivery positions of the transfer space T under the processing spaces S1 and S2 corresponding to the stages 22 in the same column, two wafers W are simultaneously carried into respective stages 22. The respective stages 22 of the processing spaces S1 and S2 raise the lift pins 26 to receive the wafers W.

Next, the rotation arm 3 is rotated clockwise from the standby position by about 30 degrees, the end effectors 32 are inserted between the wafers W and the stages 22 located at the delivery positions under the processing spaces S1 and S2, respectively, and the lift pins 26 are lowered to place the wafers W on the respective end effectors 32. After the wafers W are placed, the rotation arm 3 is rotated clockwise by 180 degrees as illustrated by a path F2 to transfer the wafers W onto the stages 22 located at the delivery positions (the holing positions of the rotation arm 3) of the transfer space T under the processing spaces S3 and S4. The stages 22 located at the delivery positions under the processing spaces S3 and S4 raise the lift pins 26 to receive the wafers W, respectively, and then the rotation arm 3 is rotated counterclockwise by about 30 degrees to move to the standby position. In this state, the wafers W are not placed on the stages 22 of the processing spaces S1 and S2, and the wafers W are placed on the stages 22 of the processing spaces S3 and S4. Subsequently, as illustrated by the paths F1, two wafers W are simultaneously carried into respective stages 22 at the delivery positions located under the processing spaces S1 and S2 by the substrate transfer mechanism 15a of the vacuum transfer chamber 14a, and the wafers W are placed on the stages 22 of the processing spaces S1 and S2, whereby the wafers W are placed on all of the stages 22 of the processing spaces S1 to S4, respectively.

Similarly, during carry-out, the wafers W placed on the stages 22 located at the delivery positions under the processing spaces S1 and S2 are first carried out to the vacuum transfer chamber 14a by the substrate transfer mechanism 15a. Next, the wafers W placed on the stages 22 located at the delivery positions under the processing spaces S3 and S4 are transferred by the rotation arm 3 to the stages 22 located at the delivery positions under the processing spaces S1 and S2. Subsequently, the wafers W placed on the stages 22 located at the delivery positions under the processing spaces S1 and S2 are carried out to the vacuum transfer chamber 14a by the substrate transfer mechanism 15a. In this way, by using the substrate transfer mechanism 15a capable of carrying in and out two wafers W at the same time and the rotation arm 3, the wafers W can be carried into and carried out of the processing spaces S1 to S4.

Meanwhile, when the wafers W are transferred by the rotation arm 3 in the processing container 20, the positions of the wafers W may be deviated from predetermined reference positions (e.g., the center positions of the processing spaces S1 to S4 of a transfer destination or the like) due to positional deviation, vibration of the rotation arm 3, or the like during the transfer of the wafers. The positional deviation of the wafers W becomes a factor that deteriorates the uniformity of processing in the processing spaces S1 to S4.

Therefore, in the substrate processing apparatus 2, the positions of the wafers W are detected during transfer of the wafers W by the rotation arm 3. Specifically, the substrate processing apparatus 2 includes sensors located between adjacent processing spaces S1 to S4 and capable of detecting the positions of the wafers W held by the rotation arm 3 during rotational operation of the rotation arm 3. In the example of FIG. 5, the substrate processing apparatus 2 includes a sensor 31a and a sensor 31b between the adjacent processing spaces S1 and S2 and between the adjacent processing spaces S3 and S4, respectively.

Each of the sensors 31a and 31b is, for example, a set including two unit sensors, and the sensors 31a and 31b are arranged on a straight line in the X direction passing through the center of the substrate processing apparatus 2 (the processing container 20), namely, passing through the center position of the circumference C. The two unit sensors of each of the sensors 31a and 31b are disposed at positions on a straight line in the X direction passing through the center position of the circumference C, with an arc of the circumference C interposed therebetween. This is to reduce a detection error due to a change in positional relationship between the two unit sensors of each of the sensors 31a and 31b when the processing container 20 is thermally expanded, by setting the expansion direction of the processing container 20 due to the thermal expansion to be the same as the arrangement direction of the two unit sensors of each of the sensors 31a and 31b. As the two unit sensors of each of the sensors 31a and 31b, for example, an optical sensor or a millimeter wave type sensor can be used.

Figure 6:
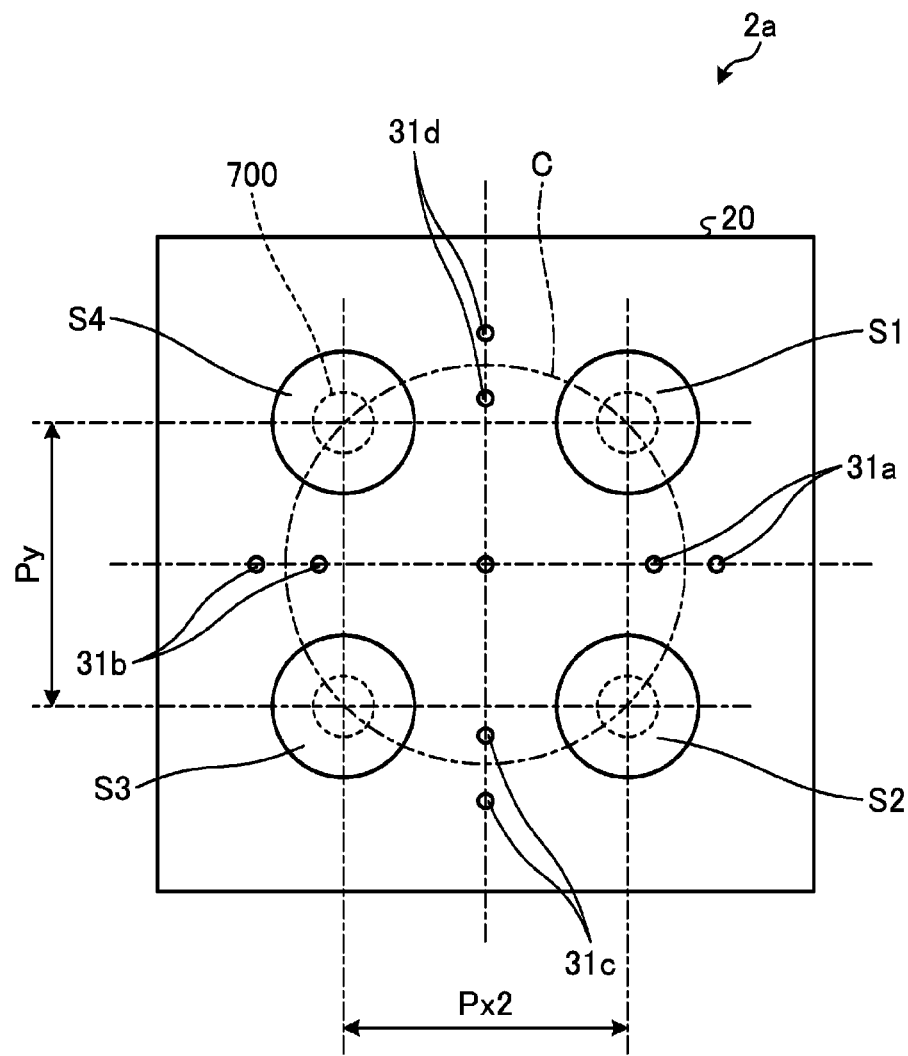
FIG. 6 is a view illustrating an example of arrangement positions of sensors.

The arrangement positions of the sensors 31a and 31b are not limited to the X direction as long as the positions are on a straight line passing through the center of the substrate processing apparatus 2. In addition, in the substrate processing apparatus 2a in which the pitch Py in the Y-direction pitch (row interval) of the stages 22 and the pitch Px2 in the X-direction pitch (column interval) of the stages 22 are the same, the sensors may be disposed on a straight line in the X-direction and a straight line in the Y direction, respectively. FIG. 6 is a view illustrating an example of arrangement positions of sensors. The substrate processing apparatus 2a illustrated in FIG. 6 includes sensors 31a to 31d which are located between adjacent processing spaces S1 and S2, between adjacent processing spaces S3 and S4, between adjacent processing spaces S2 and S3, and between adjacent processing spaces S4 and S1, respectively. The sensors 31a and 31b are arranged on a straight line in the X direction passing through the center of the substrate processing apparatus 2 (the processing container 20), that is, the center position of the circumference C. The sensors 31c and 31d are arranged on a straight line in the Y direction passing through the center position of the circumference C. This is to reduce a detection error due to a change in positional relationship between the two unit sensors of each of the sensors 31a to 31d when the processing container 20 is thermally expanded by setting the expansion direction of the processing container 20 due to the thermal expansion to be the same as the arrangement direction of the two unit sensors of each of the sensors 31a to 31d.

A description will be made referring back to FIG. 5. In the substrate processing apparatus 2, it is possible to detect the positional deviation amount of the wafer W in the processing spaces S1 to S4 of a transfer destination by detecting the position of the wafer W with the sensors 31a and 31b. For example, in the substrate processing apparatus 2, the positional deviation amount of the wafer W is calculated based on the front and rear edge positions of the wafer W detected by the sensors 31a and 31b and the output result (the rotated angles of the wafer W) of an encoder (not illustrated) provided on the rotation arm 3. The positional deviation amount of a wafer W may be calculated using, for example, a mathematical model that is capable of calculating the positional deviation amount from the front and rear edge positions of the wafer W and the rotated angle of the wafer W.

In the example of FIG. 5, the position P24 indicates a state in which the rear edge of a wafer W passes through the sensor 31b when the wafer W is transferred from the processing space S2 to the processing space S4, and the position P42 indicates a state in which the rear edge of the wafer W passes the edge sensor 31a when the wafer W is transferred. For example, the substrate processing apparatus 2 calculates the positional deviation amount of the wafer W in the processing space S4 of a transfer destination based on the rear edge position of the wafer W detected by the sensor 31b and the output result of the encoder when the rear edge of the wafer W passes through the sensor 31b. For example, the substrate processing apparatus 2 may calculate the positional deviation amount of the wafer W in the processing space S4 of a transfer destination based on the front edge position of the wafer W detected by the sensor 31b and the output result of the encoder when the front edge of the wafer W passes through the sensor 31b. For example, the substrate processing apparatus 2 may calculate the average value of the positional deviation amount of the wafer W detected when the rear edge of the wafer W passes the sensor 31b and the positional deviation amount of the wafer W detected when the front edge of the wafer W passes the sensor 31b.

The substrate processing apparatus 2 is capable of correcting the positional deviation of wafers W by moving the stages 22 at least in the XY plane in the processing spaces S1 to S4 of the transfer destination depending on the positional deviation amounts of the wafers W detected during transfer of the wafers W by the rotation arm 3. Specifically, the substrate processing apparatus 2 may include adjustment mechanisms 700 capable of adjusting the positions of the stages 22 and may correct the positional deviation of wafers W by controlling the adjustment mechanisms 700 to move the stages 22 depending on the detected deviation amounts. That is, the substrate processing apparatus 2 adjusts positional deviation such that the wafers W are located at the centers of the processing spaces S1 to S4, respectively, when the stages 22 are raised.

The adjustment mechanisms 700 and the sensors 31a and 31b are fixed to the outer surface of the bottom 27 (see FIG. 8) of the processing container 20. This is to suppress a change in positional relationship between the adjustment mechanisms 700 and the sensors 31a and 31b due to the thermal expansion of the processing container 20 by fixing the adjustment mechanisms 700 and the sensors 31a and 31b to the processing container 20 which is a common member.

Figure 7:
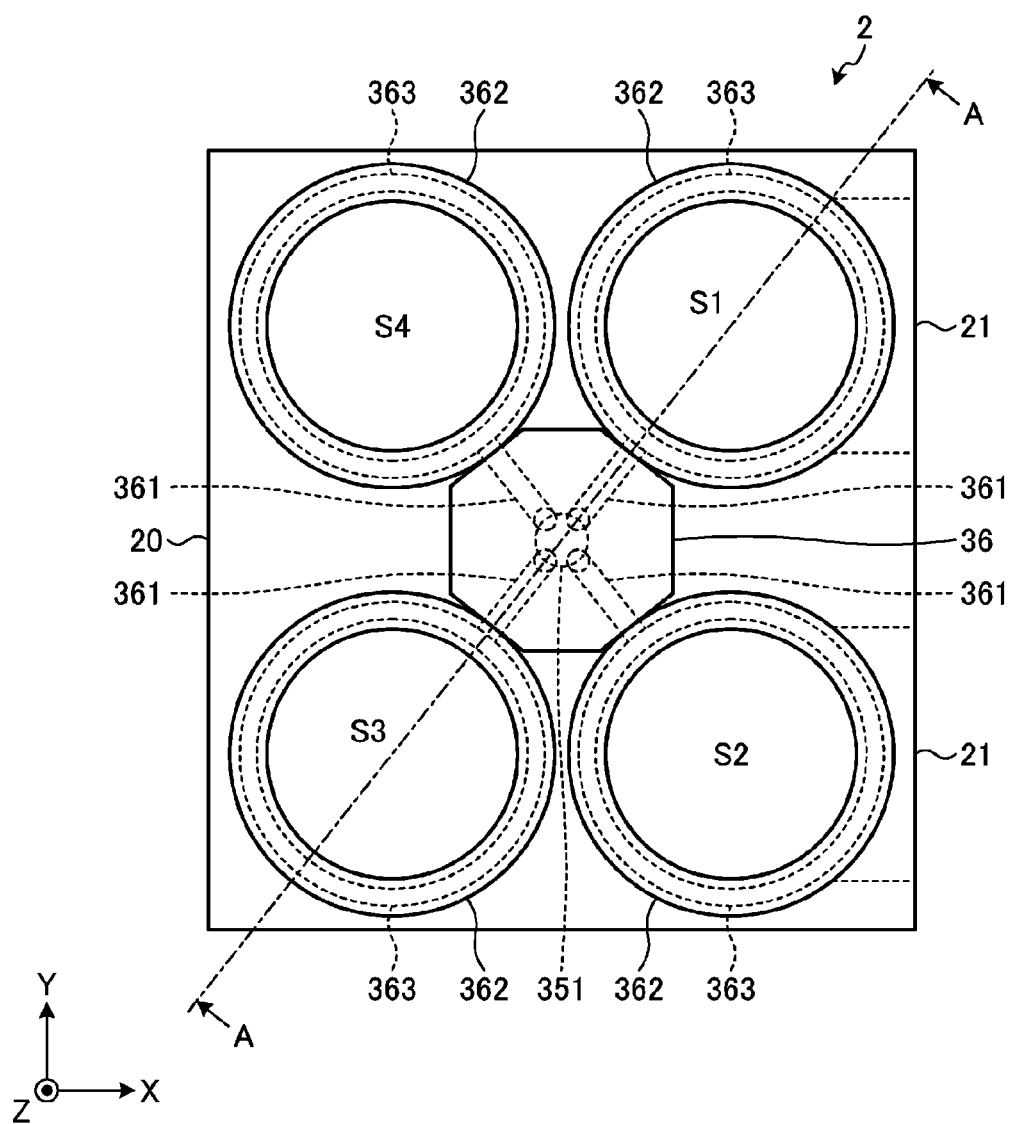
FIG. 7 is a view illustrating an example of exhaust routes of the substrate processing apparatus in the present embodiment.

FIG. 7 is a view illustrating an example of exhaust routes of the substrate processing apparatus in the present embodiment. FIG. 7 illustrates a case in which the processing container 20 is viewed from above in the state in which the gas supply part 4 to be described later is removed. As illustrated in FIG. 7, a manifold 36 is arranged in the center of the substrate processing apparatus 2. The manifold 36 includes exhaust paths 361, which are connected to the processing spaces S1 to S4, respectively. Each exhaust path 361 is connected to a hole 351 in a thrust nut 35, which will be described later, below the center of the manifold 36. Each exhaust path 361 is connected to an annular flow path 363 in each of guide members 362 provided above the processing spaces S1 to S4. That is, the gas in the processing spaces S1 to S4 is exhausted to a merging exhaust port 205 to be described later via the flow path 363, the exhaust paths 361, and the hole 351.

Figure 8:
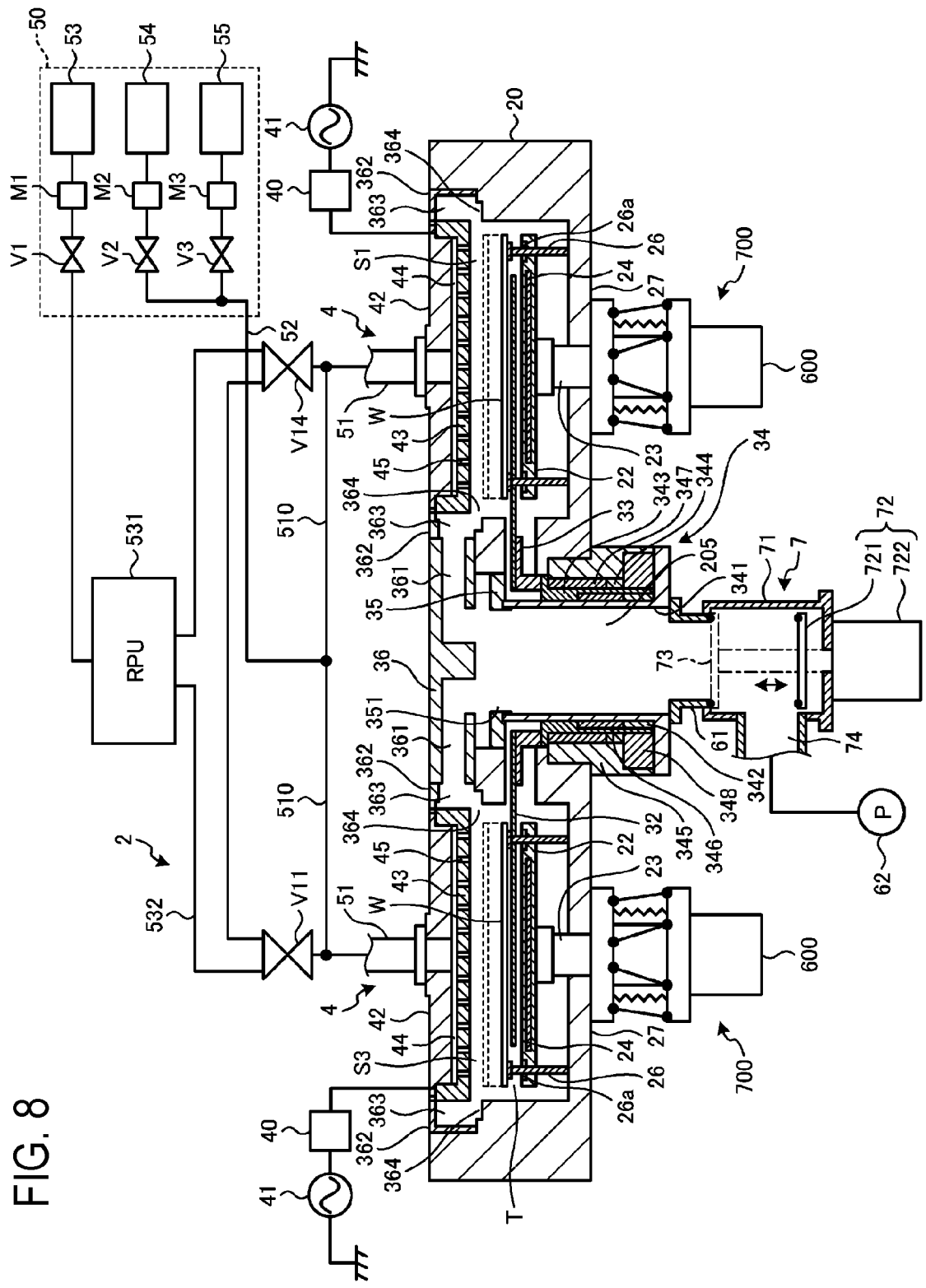
FIG. 8 is a schematic cross-sectional view illustrating an example of a configuration of the substrate processing apparatus in the present embodiment.

FIG. 8 is a view illustrating an example of a configuration of a substrate processing apparatus in the present embodiment. The cross section of FIG. 8 corresponds to the cross section of the substrate processing apparatus 2 taken along line A-A in FIG. 7. Four processing spaces S1 to S4 are configured in the same manner as each other, and are formed between stages 22, on each of which the wafer W is placed, and gas supply parts 4, which are arranged to face the stages 22, respectively. In other words, in the processing container 20, the stage 22 and the gas supply part 4 are provided for each of the four processing spaces S1 to S4. FIG. 8 illustrates processing spaces S1 and S3. Hereinafter, the processing space S1 will be described as an example.

The stage 22 also serves as a lower electrode, is made of, for example, a metal or aluminum nitride (AlN) in which a metal mesh electrode is embedded, and has a flat column shape. The stage 22 is supported by a support member 23 from the bottom side. The support member 23 is formed in a cylindrical shape, extends vertically downward, and penetrates the bottom 27 of the processing container 20. The lower end of the support member 23 is located outside the processing container 20 and connected to a rotational driving mechanism 600. The support member 23 is rotated by the rotational driving mechanism 600. The stage 22 is configured to be rotatable according to the rotation of the support member 23. An adjustment mechanism 700 is provided at the lower end of the support member 23 to adjust the position and inclination of the stage 22. The adjustment mechanism 700 is fixed to the outer surface of the bottom 27 of the processing container 20 together with the sensors 31a and 31b (see FIG. 5).

The stage 22 is configured to be capable of being raised and lowered between a processing position and a delivery position via the support member 23 by the adjustment mechanism 700. In FIG. 8, the stage 22 located at the delivery position is drawn with the solid line, and the stage 22 located at the processing position is drawn with the broken line. In addition, at the delivery position, the end effector 32 of the rotation arm 3 is inserted between the stage 22 and the wafer W and receives the wafer W from the lift pins 26. The processing position is the position when substrate processing (e.g., a film forming process) is executed, and the delivery position is the position at which the wafer W is delivered to and from the substrate transfer mechanism 15a or the end effector 32. The moving path of the wafer W held by the rotation arm 3 (e.g., the path F2 in FIG. 5) is located closer to the bottom 27 of the processing container 20 than the processing position. As a result, the wafer W can be brought closer to the sensors 31a and 31b located on the outer surface of the bottom 27 of the processing container 20 during transfer of the wafer W by the rotation arm 3, and thus the detection accuracy of the sensors 31a and 31b can be improved.

A heater 24 is embedded in the stage 22. The heater 24 heats each wafer W placed on the stage 22 to, for example, about 60 degrees C. to 600 degrees C. In addition, the stage 22 is connected to a ground potential.

In addition, the stage 22 is provided with pin through holes 26a (e.g., three), and the lift pins 26 are arranged inside these pin through holes 26a, respectively. The pin through holes 26a are provided to penetrate the stage 22 from the placement surface (top surface) of the stage 22 to the rear surface (bottom surface) opposite to the placement surface. The lift pins 26 are slidably inserted into the pin through holes 26a, respectively. The upper ends of the lift pins 26 are suspended at the placement surface sides of the pin through holes 26a. That is, the upper ends of the lift pins 26 have a diameter larger than that of the pin through holes 26a, and recesses having a diameter and a thickness larger than those of the upper ends of the lift pins 26 are formed at the upper ends of the pin through holes 26a to be capable of accommodating the upper ends of the lift pins 26, respectively. As a result, the upper ends of the lift pins 26 are engaged with the stage 22 and suspended from the placement surface sides of the pin through holes 26a, respectively. In addition, the lower ends of the lift pins 26 protrude from the rear surface of the stage 22 toward the bottom 27 side of the processing container 20.

In the state in which the stage 22 is raised to the processing position, the upper ends of the lift pins 26 are received in the recesses at the placement sides of the pin through holes 26a, respectively. When the stage 22 is lowered to the delivery position from this state, the lower ends of the lift pins 26 come into contact with the bottom 27 of the processing container 20 and the lift pins 26 move in the pin through holes 26a such that the upper ends of the lift pins 26 protrude from the placement surface of the stage 22, as illustrated in FIG. 8. In this case, the lower ends of the lift pins 26 may be configured to come into contact with, for example, a lift pin contact member located on the bottom side, instead of the bottom 27 of the processing container 20.

The gas supply part 4 is provided in the ceiling part of the processing container 20 and above the stage 22 via a guide member 362 made of an insulating member. The gas supply part 4 has a function as an upper electrode. The gas supply part 4 includes a lid 42, a shower plate 43 forming a facing surface provided to face the placement surface of the stage 22, and a gas flow chamber 44 formed between the lid 42 and the shower plate 43. A gas supply pipe 51 is connected to the lid 42, and gas ejection holes 45 penetrating the shower plate 43 in the thickness direction are arranged vertically and horizontally in the shower plate 43 such that the gas is ejected toward the stage 22 in a shower form.

Each gas supply part 4 is connected to a gas supply system 50 via a gas supply pipe 51. The gas supply system 50 includes, for example, sources of a reaction gas (a film forming gas), a purge gas source, and a cleaning gas, which are processing gases, a pipe, a valve V, a flow rate adjuster M, and the like. The gas supply system 50 includes, for example, a cleaning gas source 53, a reaction gas source 54, a purge gas source 55, valves V1 to V3 provided in the pipes of respective gas sources, and flow rate adjusters M1 to M3.

The cleaning gas source 53 is connected to the cleaning gas supply path 532 via the flow rate adjuster M1, the valve V1, and a remote plasma unit (RPU) 531. The cleaning gas supply path 532 branches into four systems at the downstream side of the RPU 531 to be connected to each gas supply pipe 51. Valves V11 to V14 are provided for respective branched pipes at the downstream side of the RPU 531, and the corresponding valves V11 to V14 are opened during cleaning. For convenience, only the valves V11 and V14 are illustrated in FIG. 8.

The reaction gas source 54 and the purge gas source 55 are connected to the gas supply path 52 via the flow rate adjusters M2 and M3 and the valves V1 and V2, respectively. The gas supply path 52 is connected to the gas supply pipe 51 via the gas supply pipe 510. In FIG. 8, the gas supply path 52 and the gas supply pipe 510 collectively illustrate respective supply paths and respective supply pipes corresponding to respective gas supply parts 4.

A high-frequency power supply 41 is connected to the shower plate 43 via a matcher 40. The shower plate 43 has a function as an upper electrode facing the stage 22. When high-frequency power is applied between the shower plate 43, which is the upper electrode, and the stage 22, which is the lower electrode, it is possible to plasmatize a gas supplied from the shower plate 43 to the processing space S1 (a reaction gas in this example) through capacitive coupling.

Next, the exhaust routes from the processing spaces S1 to S4 to the merging exhaust port 205 will be described. As illustrated in FIGS. 7 and 8, the exhaust routes pass through respective exhaust paths 361 from the annular flow paths 363 in respective guide members 362 provided above the processing spaces S1 to S4, and then are directed to the merging exhaust port 205 via the merging portion and the hole 351 below the center of the manifold 36. The exhaust paths 361 have, for example, a circular cross section.

Around each of the processing spaces S1 to S4, an exhaust guide member 362 is provided to surround each of the processing spaces S1 to S4. The guide member 362 is, for example, an annular body, which is provided to surround the region around a stage 22 located at the processing position while having a gap between the stage 22 and the guide member 362. The guide member 362 is configured to form therein a flow path 363 having, for example, a rectangular vertical cross section and an annular shape in a plan view. FIG. 7 schematically illustrates the processing spaces S1 to S4, the guide members 362, the exhaust paths 361, and the manifold 36.

The guide members 362 form slit-shaped slit exhaust ports 364, which are open toward respective processing spaces S1 to S4. In this way, the slit exhaust ports 364 are formed in the side peripheral portions of respective processing spaces S1 to S4 in the circumferential direction. The exhaust paths 361 are connected to the flow paths 363, and the processing gas exhausted from the slit exhaust ports 364 is allowed to flow toward the merging portion 351 below the center of the manifold 36.

As illustrated in FIG. 7, the set of processing spaces S1 and S2 and the set of processing spaces S3 and S4 are arranged rotationally symmetrically by 180 degrees around the manifold 36 when viewed from the top side. As a result, processing gas flow paths, which extends from respective processing spaces S1 to S4 to the hole 351 via the slit exhaust ports 364, the flow paths 363 in the guide members 362, and the exhaust paths 361, surround the hole 351 and are formed rotationally symmetrically by 180 degrees.

The hole 351 is connected to the exhaust pipe 61 via the merging exhaust port 205 inside the thrust pipe 341 of a biaxial vacuum seal 34 arranged in the central portion of the processing container 20. The exhaust pipe 61 is connected to a vacuum pump 62 forming a vacuum exhaust mechanism via a valve mechanism 7. One vacuum pump 62 is provided in, for example, one processing container 20. The exhaust pipes at the downstream sides of respective vacuum pumps 62 merge and are connected to, for example, a factory exhaust system.

The valve mechanism 7 opens and closes the processing gas flow path formed in each exhaust pipe 61 and includes, for example, a casing 71 and an opening/closing part 72. A first opening 73 connected to the upstream side exhaust pipe 61 is formed in the top surface of the casing 71, and a second opening 74 connected to the downstream side exhaust pipe 61 is formed in the side surface of the casing 71.

The opening/closing part 72 include, for example, an opening/closing valve 721 formed to have a size that closes the first opening 73, and a lifting mechanism 722 provided outside the casing 71 to raise and lower the opening/closing valve 721 inside the casing 71. The opening/closing valve 721 is configured to be capable of being raised and lowered between a closing position (indicated by the alternated long and short dash line in FIG. 8) for closing the first opening 73 and an opening position (indicated by the solid line in FIG. 8) retracted to the side below the first and second openings 73 and 74. When the opening/closing valve 721 is located at the closing position, the downstream end of the merging exhaust port 205 is closed, and the exhaust of the interior of the processing container 20 is stopped. In addition, when the opening/closing valve 721 is located at the opening position, the downstream end of the merging exhaust port 205 is opened and the interior of the processing container 20 is exhausted.

Next, the bi-axial vacuum seal 34 and the thrust nut 35 will be described. The biaxial vacuum seal 34 includes a thrust pipe 341, bearings 342 and 344, a rotor 343, a main body 345, magnetic fluid seals 346 and 347, and a direct drive motor 348.

The thrust pipe 341 is a non-rotating central shaft and receives a thrust load applied to the upper center of the substrate processing apparatus 2 via the thrust nut 35. That is, the thrust pipe 341 receives a vacuum load applied to the central portion of the substrate processing apparatus 2 when a vacuum atmosphere is created in the processing spaces S1 to S4, thereby suppressing the deformation of the upper portion of the substrate processing apparatus 2. The thrust pipe 341 has a hollow structure, and the interior of the thrust pipe 341 forms the merging exhaust port 205. The top surface of the thrust pipe 341 is in contact with the bottom surface of the thrust nut 35. In addition, the inner surface of the upper portion of the thrust pipe 341 and the outer surface of a convex portion at the inner peripheral side of the thrust nut 35 are sealed by an O-ring (not illustrated).

The outer peripheral side surface of the thrust nut 35 has a screw structure, and the thrust nut 35 is screwed to a partition wall of the central portion of the processing container 20. The manifold 36 is provided above the central portion of the processing container 20. The manifold 36, the partition wall in the central portion of the processing container 20, the thrust nut 35, and the thrust pipe 341 receive the thrust load.

The bearing 342 is a radial bearing that holds the rotor 343 at the thrust pipe 341 side. The bearing 344 is a radial bearing that holds the rotor 343 at the main body 345 side. The rotor 343 is arranged concentrically with the thrust pipe 341 and is a rotation shaft in the center of the rotation arm 3. In addition, the base member 33 is connected to the rotor 343. When the rotor 343 rotates, the rotation arm 3, that is, the end effectors 32 and the base member 33 rotate.

The main body 345 accommodates therein the bearings 342 and 344, the rotor 343, the magnetic fluid seals 346 and 347, and the direct drive motor 348. The magnetic fluid seals 346 and 347 are arranged at the inner peripheral side and the outer peripheral side of the rotor 343, and seal the processing spaces S1 to S4 with respect to the exterior. The direct drive motor 348 is connected to the rotor 343 and drives the rotor 343, thereby rotating the rotation arm 3.

In this way, in the biaxial vacuum seal 34, the thrust pipe 341, which is the central axis that does not rotate on the first axis, plays the role of a gas exhaust pipe while supporting the load of the upper portion of the processing container 20, and the rotor 343 on the second axis plays the role of rotating the rotation arm 3.

[Operation of Substrate Processing Apparatus]

Next, the operation of the substrate processing apparatus in the embodiment will be described with reference to FIG. 9. FIG. 9 is a flowchart illustrating a processing procedure executed by the substrate processing apparatus in the present embodiment. With reference to FIG. 9, a series of processes in which wafers W of the processing spaces S1 and S2, which are first processing spaces, are transferred to the processing spaces S3 and S4, which are second processing spaces, and wafer processing is performed in the processing spaces S3 and S4 will be described. The various processes illustrated in FIG. 9 are mainly executed based on the control by the controller 8.

First, teaching is performed to match the respective center positions of the processing spaces S1 to S4, the center positions of the respective end effectors 32 of the rotation arm 3, the center positions of the respective stages 22 of the processing spaces S1 to S4, and the wafers placed on the stages 22. In the teaching, for example, the respective center positions of the processing spaces S1 to S4 are set as reference positions. The reference positions are recorded, for example, in the storage part of the controller 8.

Next, the wafers W located in the processing spaces S1 and S2 are placed on the rotation arm 3 (step S101). In step S101, the stages 22 of the processing spaces S1 and S2 are moved to the delivery positions of the transfer space T at the lower side, and each stage 22 lifts the wafer W by raising the lift pin 26. Then, the rotation arm 3 is rotated clockwise from the standby position by about 30 degrees to 45 degrees, the end effectors 32 are inserted between the stages 22 located at the transfer positions under the processing spaces S1 and S2 and the wafers W, respectively, and lift pins 26 are lowered to place the wafers W on the respective end effectors 32. The rotated angle of the rotation arm 3 at this time depends on the magnitudes of the pitch Px and the pitch Py.

Next, the rotation of the rotation arm 3 is started, and the transfer of the wafers W from the processing spaces S1 and S2 to the processing spaces S3 and S4 is started (step S102).

While the wafers W are being transferred from the processing spaces S1 and S2 to the processing spaces S3 and S4 by the rotation arm 3, the positional deviation amounts of the wafers W from the reference positions are detected (step S103). In step S103, for example, the controller 8 calculates the positional deviation amount of each wafer W based on the front and rear edge positions of the wafer W detected by the sensors 31*a* and 31*b* and the output result (the rotated angle of the wafer W) of an encoder (not illustrated) provided on the rotation arm 3.

Next, the positions of the stages 22 in the processing spaces S3 and S4 are adjusted by moving the stages 22 in the processing spaces S3 and S4 of the transfer destination depending on the detected deviation amounts (step S104). In step S104, for example, the controller 8 controls the adjustment mechanism 700 depending on the detected deviation amounts to move the stages 22 of the processing spaces S3 and S4 to positions where the deviation amount is canceled. As a result, the positions of the stages 22 in the processing spaces S3 and S4 are adjusted to be matched with the center positions of the wafers W.

Next, when the rotation arm 3 rotates clockwise from the processing spaces S1 and S2 by 180 degrees and the wafers W arrive at the processing spaces S3 and S4 (step S105), the wafers W are delivered to the stages 22 of the processing spaces S3 and S4 (step S106). In step S106, when the stages 22 located at the delivery positions under the processing spaces S3 and S4 receive the wafers W by raising the lift pins 26, respectively, the rotation arm 3 is rotated counterclockwise by about 30 degrees to 45 degrees to move to the standby position. In this step, the wafers W are placed on the stages 22 of the processing spaces S3 and S4, respectively.

Next, the positions of the stages 22 of the processing spaces S3 and S4 are moved to the center positions of the processing spaces S3 and S4 as the reference positions (step S107). As a result, the positions of the wafers W on the stages 22 of the processing spaces S3 and S4 are adjusted to coincide with the center positions of the processing spaces S3 and S4 as the reference positions.

Next, wafer processing is performed in the processing spaces S3 and S4 (step S108). In this way, a series of processes are completed.

As described above, the processing module (for example, the substrate processing apparatuses 2 and 2*a*) according to the present embodiment includes a processing container (e.g., the processing container 20), a rotation arm (e.g., the rotation arm 3), and a sensor (e.g., the sensors 31*a* to 31*d*). The processing container includes therein processing spaces (e.g., the processing spaces S1 to S4), wherein the center of each processing stage is located on the same circumference (e.g., the circumference C) and the stages (e.g., the stages 22) are arranged in the processing spaces, respectively. The rotation arm includes holders (e.g., the end effectors 32) capable of holding wafers (e.g., wafers W) to be placed on respective stages in the processing spaces and is configured to be rotatable about the center of the circumference as a rotation axis. A sensor is located between adjacent processing spaces to be capable of detecting the positions of wafers held by the rotation arm during rotational operation of the rotation arm. As a result, it is possible to detect the positional deviation of the wafers during transfer in the processing container. In addition, even when positional deviation of the wafers occurs when the wafers are transferred to a processing module by a wafer transfer mechanism (e.g., the substrate transfer mechanism 15a or 15b), such positional deviation can be detected together with the positional deviation of the wafers during transfer in the processing container.

In addition, the sensor according to the embodiment is a set including two unit sensors, and may be arranged on a straight line passing through the center position of the circumference. The two unit sensors may be arranged on a straight line and at positions where a circular arc of the circumference is interposed between the two unit sensors. As a result, it is possible to reduce a detection error due to a change in the positional relationship between the two unit sensors when the processing container is thermally expanded.

The processing module according to an embodiment may further have an adjustment mechanism configured to move the stages depending on the positional deviation amounts of the wafers calculated from the positions of the wafers detected by the sensor. This makes it possible to correct the positional deviation of the wafers during transfer in the processing container.

The adjustment mechanism and the sensors according to an embodiment may be fixed to the outer surface of the bottom of the processing container. This makes it possible to suppress a change in the positional relationship between the adjustment mechanism and the sensor due to thermal expansion of the processing container.

In addition, the stage according to an embodiment may be raised and lowered between a processing position for processing the wafers mounted on the stages and a delivery position for performing wafer delivery between the stages and the holders of the rotation arm. The moving route of the wafers held by the rotation arm may be located at a position closer to the bottom of the processing container than the processing position. This makes it possible to bring wafers closer to the sensor side during transfer of the wafers by the rotation arm so that the detection accuracy of the sensor can be improved.

The rotation arm according to an embodiment may transfer wafers between two or more processing spaces in which different processes are performed (e.g., between the processing spaces S1 and S2 and the processing spaces S3 and S4) among processing spaces. This makes it possible to shorten the length of time related to wafer transfer in the case in which different processes are repeated between two or more processing spaces.

In a processing method according to an embodiment, wafers located in the first processing space are placed on the rotation arm. In the processing method, the positional deviation amounts of the wafers from the reference positions while the rotation arm is rotated to transfer the wafers from the first processing space to the second processing space. In the processing method, the positions of the stages are adjusted by moving the stages arranged in the second processing space depending on the deviation amounts. In the processing method, the wafers are delivered from the rotation arm to the adjusted stages. In the processing method, the positions of the stages are moved to the center positions of the second processing spaces as the reference positions. In the processing method, wafer processing is performed in the second processing space. This makes it possible to perform wafer processing in a state in which the positional deviation of the wafers during transfer in the processing container is corrected. As a result, deterioration of processing uniformity regarding the wafers can be suppressed.

It should be understood that the embodiments disclosed herein are exemplary in all respects and are not restrictive. The above-described embodiments may be omitted, replaced, or modified in various forms without departing from the scope and spirit of the appended claims.

For example, in the embodiments described above, an example in which the substrate processing apparatus 2 or 2a is an apparatus that performs plasma CVD processing as substrate processing has been described, but the technique disclosed herein may be applied to any apparatus that performs other substrate processing, such as plasma etching.

In addition, in the above-described embodiments, the direct drive motor 348 is used as a method of driving the rotor 343 in the biaxial vacuum seal 34, but the present disclosure is not limited thereto. For example, the rotor 343 may be provided with a pulley and may be driven using a timing bell from a motor provided outside the biaxial vacuum seal 34.

According to the present disclosure, it is possible to detect positional deviation of a wafer during transfer in a processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing module comprising:
   a processing container including therein processing spaces in which stages are disposed, respectively, wherein a center of each of the processing spaces is located on a same circumference in the processing container in a plan view;
   a rotation arm including holders configured to hold wafers, which are placed on the stages of the processing spaces, respectively, wherein the rotation arm is rotatable around a center of the circumference as a rotation axis;
   a sensor located between adjacent processing spaces among the processing spaces and configured to detect positions of the wafers held by the rotation arm during rotational operation of the rotation arm; and
   an adjustment mechanism configured to move the stages depending on positional deviation amounts of the wafers, wherein the positional deviation amounts are calculated from the positions of the wafers detected by the sensor.

2. The processing module of claim 1, wherein the sensor is a set including two unit sensors and is disposed on a straight line passing through a center position of the circumference.

3. The processing module of claim 2, wherein the two unit sensors are disposed on the straight line and at positions between which a circular arc of the circumference is interposed.

4. The processing module of claim 3, wherein the adjustment mechanism and the sensor are fixed to an outer surface of a bottom of the processing container.

5. The processing module of claim 4, wherein the stage is configured to be raised and lowered between a processing position at which a process is performed on the wafers placed on the stages and a delivery position at which a delivery of the wafers is performed between the stage and each of the holders of the rotation arm, and a moving route of the wafers held by the rotation arm is located at a position closer to a bottom of the processing container than the processing position.

6. The processing module in claim 5, wherein the rotation arm is configured to transfer the wafers between two or more processing spaces in which different processes are performed among the processing spaces.

7. The processing module of claim 1, wherein the stage is configured to be raised and lowered between a processing position at which a process is performed on the wafers placed on the stages and a delivery position at which a delivery of the wafers is performed between the stage and each of the holders of the rotation arm, and a moving route of the wafers held by the rotation arm is located at a position closer to a bottom of the processing container than the processing position.

8. The processing module in claim 1, wherein the rotation arm is configured to transfer the wafers between two or more processing spaces in which different processes are performed among the processing spaces.

9. A processing method comprising:

placing a wafer located in a first processing space on a rotation arm;

detecting a positional deviation amount of the wafer from a reference position while the wafer is transferred from the first processing space to a second process space by rotating the rotation arm;

moving a stage disposed in the second processing space according to the positional deviation amount to adjust a position of the stage;

delivering the wafer from the rotation arm to the adjusted stage;

moving a position of the stage to a center position of the second processing space as the reference position; and performing a wafer processing in the second processing space.

* * * * *